United States Patent [19]

Shimizu et al.

[11] Patent Number: 4,817,197

[45] Date of Patent: Mar. 28, 1989

[54] MOBILE COMMUNICATION APPARATUS

[75] Inventors: Isao Shimizu; Katsunori Miyatake; Shuji Urabe; Kazuaki Murota, all of Kanagawa, Japan

[73] Assignee: Nippon Telegraph and Telephone Corporation, Tokyo, Japan

[21] Appl. No.: 72,819

[22] Filed: Jul. 13, 1987

[30] Foreign Application Priority Data

| Jul. 18, 1986 | [JP] | Japan | 61-168004 |
| Jul. 18, 1986 | [JP] | Japan | 61-168005 |
| Apr. 14, 1987 | [JP] | Japan | 62-89807 |
| Apr. 14, 1987 | [JP] | Japan | 62-89808 |
| May 13, 1987 | [JP] | Japan | 62-114534 |
| May 14, 1987 | [JP] | Japan | 62-115929 |
| May 14, 1987 | [JP] | Japan | 62-115930 |

[51] Int. Cl.$^4$ .................. H03D 3/24; H04B 17/00
[52] U.S. Cl. .................. 455/208; 455/260; 455/314; 455/316; 455/67; 331/17
[58] Field of Search .................. 455/314–316, 455/338, 337, 258–260, 263, 265, 207–209, 183, 216, 134, 67, 69, 70, 71; 331/17, 34, 40, 41; 375/78, 80, 81, 99, 103

[56] References Cited

U.S. PATENT DOCUMENTS

| 2,898,455 | 8/1959 | Hymas et al. | 455/134 |
| 3,230,453 | 1/1966 | Boor et al. | 455/67 X |
| 4,457,006 | 6/1984 | Maine | 455/316 X |
| 4,628,518 | 12/1986 | Chadwick et al. | 455/208 X |
| 4,670,889 | 6/1987 | Hewitt | 455/71 X |
| 4,696,056 | 9/1987 | Morita | 455/316 X |

FOREIGN PATENT DOCUMENTS 0049047 4/1980 Japan ............. 455/208

Primary Examiner—Theodore M. Blum
Assistant Examiner—Gilberto Barrón, Jr.
Attorney, Agent, or Firm—Armstrong, Nikaido, Marmelstein & Kubovcik

[57] ABSTRACT

Local frequency which is subject to fluctuate in a mobile subscriber set is locked to stable transmit frequency of a base station. A mobile subscriber set (FIG. 3) for angle modulated signal has a frequency mixer (3.6, 3.9), for converting wireless receive frequency to an intermediate frequency by using local frequency ($F_{L1}$, $F_{L2}$), a limiter (3.11) for limiting amplitude of intermediate frequency signal, a discriminator (3.12) for demodulating angle modulated signal, a standard oscillator (3.1) by using a quartz crystal oscillator and a synthesizer (64) for providing local frequency for said mixer (3.6), a digital frequency counter (3.14) for measuring intermediate frequency, and control means (3.16) for adjusting said standard oscillator (3.1) depending upon error of intermediate frequency measured by said counter (3.14).

9 Claims, 9 Drawing Sheets

MOBILE COMMUNICATION APPARATUS

BACKGROUND OF THE INVENTION

The present invention relates to a wireless receiver set which has the facility to measure the receive frequency for automatic frequency control in a communication system using an angle modulation system. The present invention is preferably applicable to a mobile subscriber set using a narrow band in the UHF band.

The drift of carrier frequency degrades the transmission characteristics considerably. The frequency drift deteriorates the distortion, frequency response characteristics, and/or error rate in the passband and furthermore, that frequency drift increases the undesirable leakage power to adjacent channels. In order to prevent the effect by the frequency drift, one of the following must take place.

(a) The communication system is designed so that the interval of the radio channels is considerably larger than the bandwidth of each channel.

(b) A local oscillator and/or modulator which might cause the frequency drift is sufficiently stable.

(c) The frequency drift is measured, and the drift is compensated for automatically.

Among the above items the first one is not practical, since the wireless channels are limited in number and bandwidth.

The second proposal is also not practical in case of a mobile subscriber set, although it is useful for a fixed base station which may install a highly stable standard oscillator, since a small subscriber set must be simple in structure and can not have a highly stable standard oscillator. A TCXO (Temperature Compensated Crystal Oscillator) has been known for compensating frequency drift of carrier frequency due to temperature change. However, when a TCXO is installed in a mobile subscriber set, the frequency stability is practically up to 1-1.5 ppm (1 ppm = $10^{-6}$).

Further, a DTCXO system (Digitally Temperature Compensated Crystal Oscillator) is proposed in IEEE Proc. 37th Frequency control symposium pp 434–441, by T. Uno et al, in which a memory stores the frequency change by temperature change, and a capacitance array is adjusted according to the measured temperature and the content of the memory, has been proposed. However, that DTCXO system can not compensate secular change of an oscillator, although it can provide the stability up to 1 ppm.

The above third proposal is classified into two methods.

(a) AFC (Automatic Frequency Control)

FIG. 1 shows a block diagram of an automatic frequency control system which has been used in a prior FM receiver. An FM signal received by an antenna 1.1 is frequency converted by a mixer 1.3 which receives a local frequency of a local oscillator 1.2. The IF signal (Intermediate Frequency signal) which is the output of the mixer 1.3 is applied to a frequency discriminator 1.5 through an IF amplifier 1.4. The demodulated speech signal is obtained at the output 1.6 of the frequency discriminator 1.5. Since the frequency discriminator 1.5 provides DC voltage which is proportional to frequency error of an input frequency, or the error of the input frequency from the center frequency of the frequency discriminator, that DC voltage is applied to a variable capacitance diode 1.8 through a level converter 1.7 which adjusts the voltage level of that DC voltage to the proper voltage for the operation of the variable capacitance diode 1.8. The variable capacitance diode 1.8 is a component of a resonant circuit of a local oscillator. When the local frequency by the variable frequency oscillator 1.2 drifts, the IF frequency then drifts, and the amount of the drift induces the DC voltage at the output of the discriminator 1.5. That DC voltage is applied to the variable capacitor diode 1.8 so that the DC voltage or the frequency error is decreased.

However, the prior system of FIG. 1 has the disadvantage that the frequency stability is not enough for a narrow band mobile communication, since the error of the center frequency of a frequency discriminator can not be less than 0.5 kHz on the condition of mass production. In other words, the frequency error of the local oscillator can not be less than the error of the center frequency of a discriminator. Therefore, the system of FIG. 1 can not be used in an application which requires very small frequency drift.

(b) Phase lock of a local oscillator to receive frequency

FIG. 2 shows a block diagram of another prior art (Japanese patent publication No. 1544/65), in which a local oscillator is phaselocked to a receive frequency which is sufficiently stable. In FIG. 2, the numeral 2.1 is a reception antenna, 2.2 is a first receiver for communication, 2.3 is a second receiver for frequency control for receiving reference frequency from a base station. The second receiver 2.3 provides the received reference frequency to the phse detector 2.4. The numeral 2.5 is a voltage controlled crystal oscillator, output of which is applied to the phase detector 2.4. The output of the phase detector 2.4 is applied to the oscillator 2.5. Thus, the output frequency of the oscillator 2.5 is locked to the reference frequency from the base station.

The local oscillator for the first receiver 2.2 has another phase detector 2.6, a voltage controlled oscillator 2.7 and a frequency divider 2.8. The output of the crystal oscillator 2.5 is compared with the output of the voltage controlled oscillator 2.7 through the frequency divider 2.8, and the output of the phase detector 2.6 controls the voltage controlled oscillator 2.7 so that the oscillator 2.7 is locked to the crystal oscillator 2.5. Therefore, the accuracy or the stability of the oscillator 2.7 is the same as that of the base station. Since the reference frequency from the base station is supposed to be accurate enough, the local frequency in the configuration of FIG. 2 is also accurate.

However, the system of FIG. 2 has the following two disadvantages. First, a receive side requires not only a first receiver 2.2 for communication, but also a second receiver merely for receiving reference frequency. Thus, the structure of the receiver set must be complicated. Further, the transmission of the reference frequency merely for frequency control of a receiver is not desirable in view of the use of valuable frequency band. Secondly, when the fading is severe, and the receive level is low, it suffers from much phase change, the phase lock loop would not operate correctly, and the regeneration of the reference frequency would be impossible.

SUMMARY OF THE INVENTION

It is an object, therefore, of the present invention to overcome the disadvantages and limitations of a prior mobile communicaiton system by providing a new and improved mobile communication system.

It is also an object of the present invention to provide a mobile subscriber set which is simple in structure, and provides accurate local frequency and/or accurate transmit frequency.

It is also an object of the present invention to provide a mobile subscriber set which is free from distortion, data transmission error, and leakage power to adjacent radio channels.

The above and other objects are attained by a mobile communication system for angle modulated signal having at least a frequency mixer for converting radio receive frequency to intermediate frequency by using local frequency, a limiter for limiting amplitude of intermediate frequency signal, a discriminator coupled with output of said limiter for demodulating angle modulated signal, a standard frequency oscillator by a quartz crystal oscillator for providing said local frequency, a digital frequency counter coupled with output of said limiter to measure intermediate frequency, and control means for adjusting frequency of said quartz crystal oscillator depending upon output of said digital frequency counter.

The main concept of the present invention is to measure intermediate frequency at a mobile subscriber set based upon the facts that (1) it is possible to use an amplitude limiter to suppress receiver level change in angle modulation system, (2) a noise generated in the limiter may be removed simply by using a bandpass filter or a phase locked loop, (3) an error of a local frequency of a receiver is kept in an intermediate frequency even when a radio receive frequency is converted to the intermediate frequency by a plurality of frequency mixers, (4) an intermediate frequency which is relatively low frequency can be measured accurately by using a digital counter, (5) a time base signal for operating the digital counter has not to be highly accurate one when the frequency to be measured is low, (6) the structure of the digital counter is simple, and is implemented merely by a single middle scale intergration circuit.

Therefore, the present invention measures the intermediate frequency of a receiver based upon the above facts and the assumption that the transmit frequency by a mobile base station is accurate in order to detect an error of a local frequency of a receiver.

Further, when a receiver is a multi-conversion receiver, the error of the measurement due to the error of a second local frequency is compensated by calculating intermediate frequency with a time base signal by a first local frequency, and other local frequencies.

BRIEF DESCRIPTION OF THE DRAWINGS

The foregoing and the other objects, features, and attendant advantages of the present invention will be appreciated as the same become better understood by means of the following description and accompanying drawings wherein.

DESCRIPTION OF THE PREFERRED EMBODIMENTS

Figure 1:
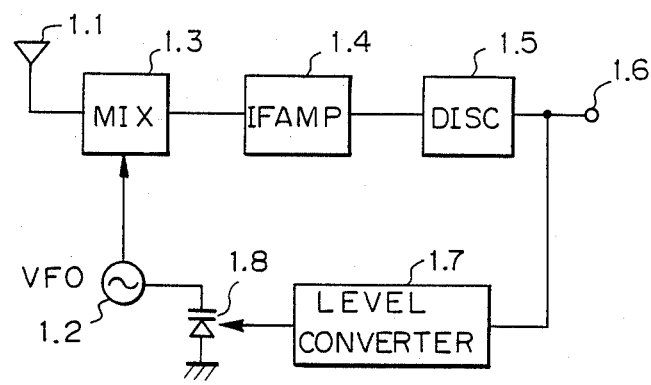
FIG. 1 is a block diagram of a prior AFC circuit.
Figure 2:
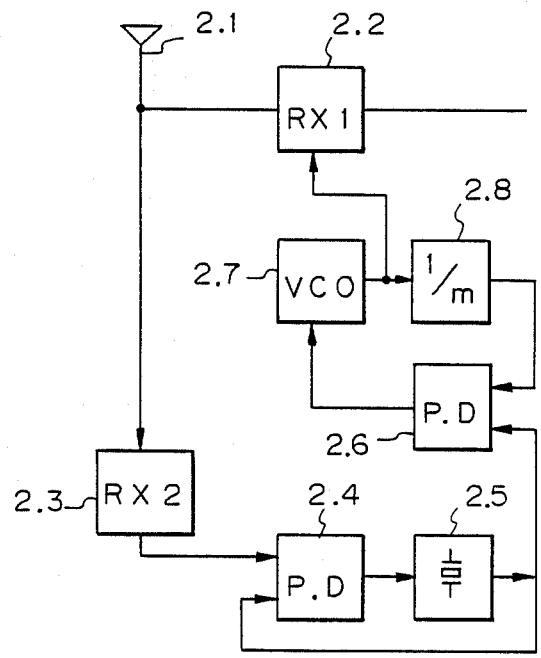
FIG. 2 is a block diagram of a prior receiver which has an oscillator locked to a high precision frequency standard.
Figure 3:
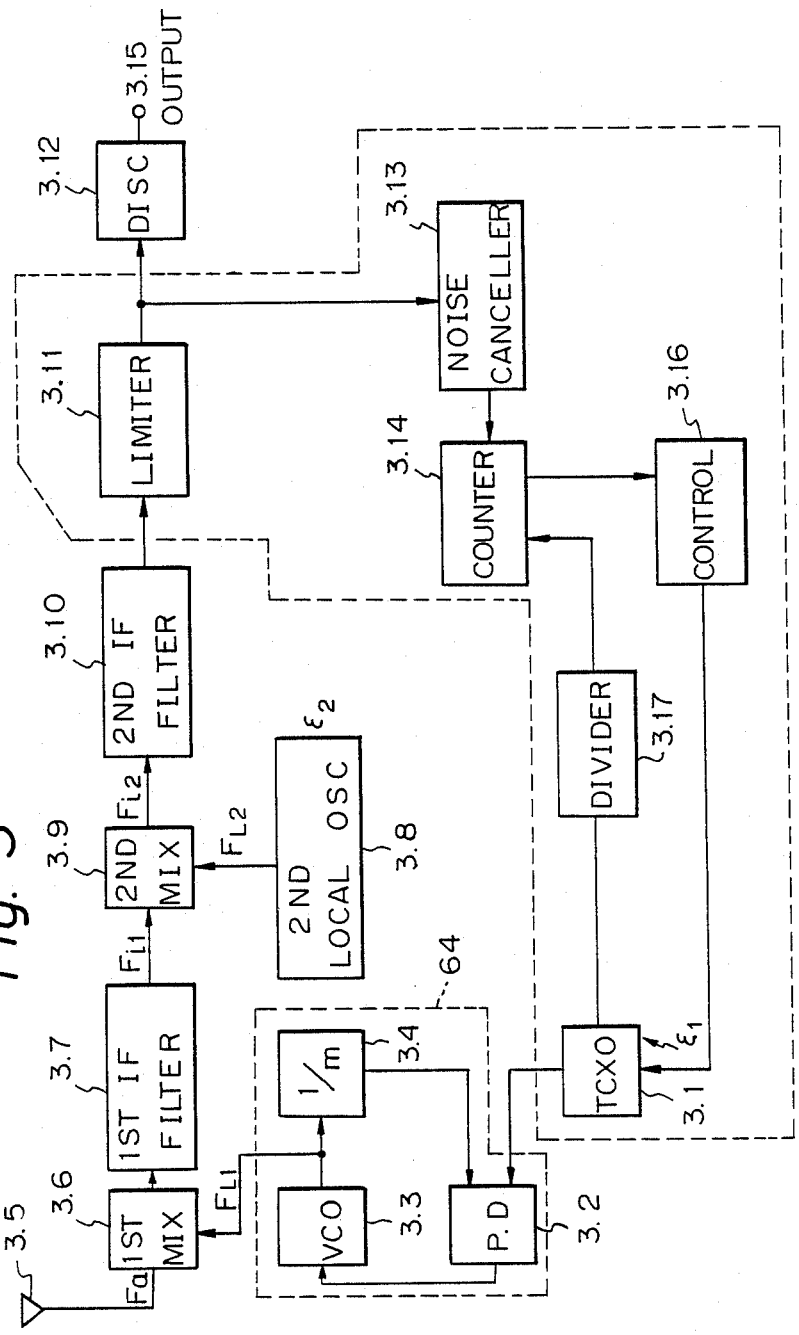
FIG. 3 is a block diagram of a receiver according to the present invention.

FIG. 3 shows a block diagram of a mobile subscriber receiver set according to the present invention. In the figure, the numeral 3.1 is a frequency standard oscillator by using a temperature compensated quartz crystal oscillator (TCXO) which is subject to measure according to the present present invention. The numeral 64 composes a frequency synthesizer with a phase detector 3.2, a voltage controlled oscillator (VCO) 3.3 and a frequency divider 3.4. The frequency synthesizer 64 provides the first local frequency $F_{L1}$ for the first mixer 3.6. It should be appreciated that the output of the frequency synthesizer is locked or has some relations with the standard frequency of the oscillator 3.1. The receive signal by the antenna 3.5 is applied to the first frequency mixer 3.6 which converts the receive frequency to the first intermediate frequency using the first local frequency $F_{L1}$ which is the output of the frequency synthesizer 64 (or the output of the voltage controlled oscillator 3.3). The mixer 3.6 provides the sum and the difference of the receive frequency and the first local frequency. The first intermediate frequency filter 3.7 selects one of them as a first intermediate frequency. The first intermediate frequency $F_{i1}$ is applied to the second mixer 3.9 which converts the input frequency $F_{i1}$ by using the second local frequency $F_{L2}$ and provides the sum and the difference of $F_{i1}$ and $F_{L2}$. The second intermediate frequency (IF) filter 3.10 selects one of them as the second intermediate frequency. The second IF frequency is for instance 455 kHz.

In a mobile communication using VHF/UHF band, a double conversion receiver is used because carrier frequency is considerably higher than a reasonable intermediate frequency, and an intermediate frequency cannot be so high since a high gain amplifier in that high intermediate frequency can not be obtained. Therefore, the present embodiment takes a double conversion receiver.

The output of the second IF filter 3.10 is applied to an amplitude limiter 3.11 which limits or amplifies an input signal so that the amplifier saturates or the amplitude of the signal is limited. The discriminator 3.12 coupled with output of the limiter 3.11 demodulates angle modulated signal to a baseband signal, which is provided to an output terminal 3.15.

Simultaneously, the output of the limiter 3.11 is applied to the digital frequency counter 3.14 through the noise canceller 3.13, which is implemented for instance by a bandpass filter so that wideband noise generated by the limiter is cancelled.

The timebase signal for the digital counter 3.14 is provide by the frequency standard oscillator 3.1 by a quartz oscillator through a frequency divider 3.17, and the oscillation frequency of the oscillator 3.1 is controlled by the measured result by the counter 3.14 through the control circuit 3.16. The control circuit 3.16 compares the measured result by the counter 3.14 with the reference value, and provides the control analog voltage to the oscillator 3.1 depending upon the error which is the difference between said reference frequency and the measured frequency. The time base signal applied to the counter 3.14 operates the counter 3.14 so that the counter 3.14 counts input pulses during a gate signal defined by a time base signal. The time base signal by a standard frequency oscillator in a mobile subscriber receiver is enough for high precision measurement when the intermediate frequency is around 455 kHz, because the error is less than 45.5 Hz when the accuracy of the standard oscillator is $10^{-4}$, which is obtained easily.

The measurement accuracy when the time base signal by the standard oscillator 3.1 is used is now analyzed.

It is assumed in FIG. 3 that the receive frequency by the antenna 3.5 is $F_a$, the first intermediate frequency is $F_{i1}$, the first local frequency is $F_{L1}$, the second intermediate frequency is $F_{i2}$, the second local frequency is $F_{L2}$, the error of the standard oscillator (TCXO) which is used for the first local frequency is $\epsilon_1$, the error of the second local frequency is $\epsilon_2$, the measured second intermediate frequency is $\overline{F_{i2}}$. Then, the following equation is satisfied.

$$F_{i2} = F_a - F_{L1} - F_{L2} \quad (1)$$

When the error of the standard oscillator (TCXO) is $\epsilon_1$, the first local frequency $\overline{F_{L1}}$ becomes as follows.

$$\overline{F_{L1}} = F_{L1}(1+\epsilon_1) \quad (2)$$

Assuming that the error $\epsilon_2$ of the second local frequency is zero, the second intermediate frequency $\overline{F_{i2}}$ is as follows.

$$\overline{F_{i2}} = F_a - \overline{F_{L1}} - F_{L2} = F_a - F_{L1}(1+\epsilon_1) - F_{L2} \quad (3)$$

The measured second intermediate frequency is as follows when the standard oscillator TCXO is used as a time base signal.

$$\hat{F_{i2}} = \overline{F_{i2}}/(1+\epsilon_1) = (F_a - F_{L1}(1'\epsilon_1) - F_{L2})/(1+\epsilon_1) \quad (4)$$

The measurement error $\Delta F_{i2}$ is shown by the equation (5).

$$\Delta F_{i2} = \overline{F_{i2}} - \hat{F_{i2}} = (F_a - F_{L2})(1/(1+\epsilon_1) - 1) + F_{L1}\epsilon_1 \quad (5)$$

The calculated examples of the value $\Delta F_{i2}$ is shown in the table 1 where $F_a = 872.5$ MHz, $F_{L1} = 782.5$ MHz, $F_{L2} = 89.455$ MHz, $F_{i1} = 90$ MHz, and $F_{i2} = 455$ kHz.

TABLE 1

| $\epsilon_1$(ppm) | 0.5 | 1.0 | 1.5 | 2.0 |
|---|---|---|---|---|
| $\Delta F_{i2}$(Hz) | 0.2275 | 0.455 | 0.6825 | 0.910 |

The ppm means the error of $10^{-6}$.

It should be noted that the error of the local frequency is kept in the intermediate frequency even when the radio frequency is converted to the intermediate frequency. So, high accurrate measurement is possible by measuring the second intermediate frequency which is considerably lower than the radio frequency and/or the first local frequency.

Figure 4:
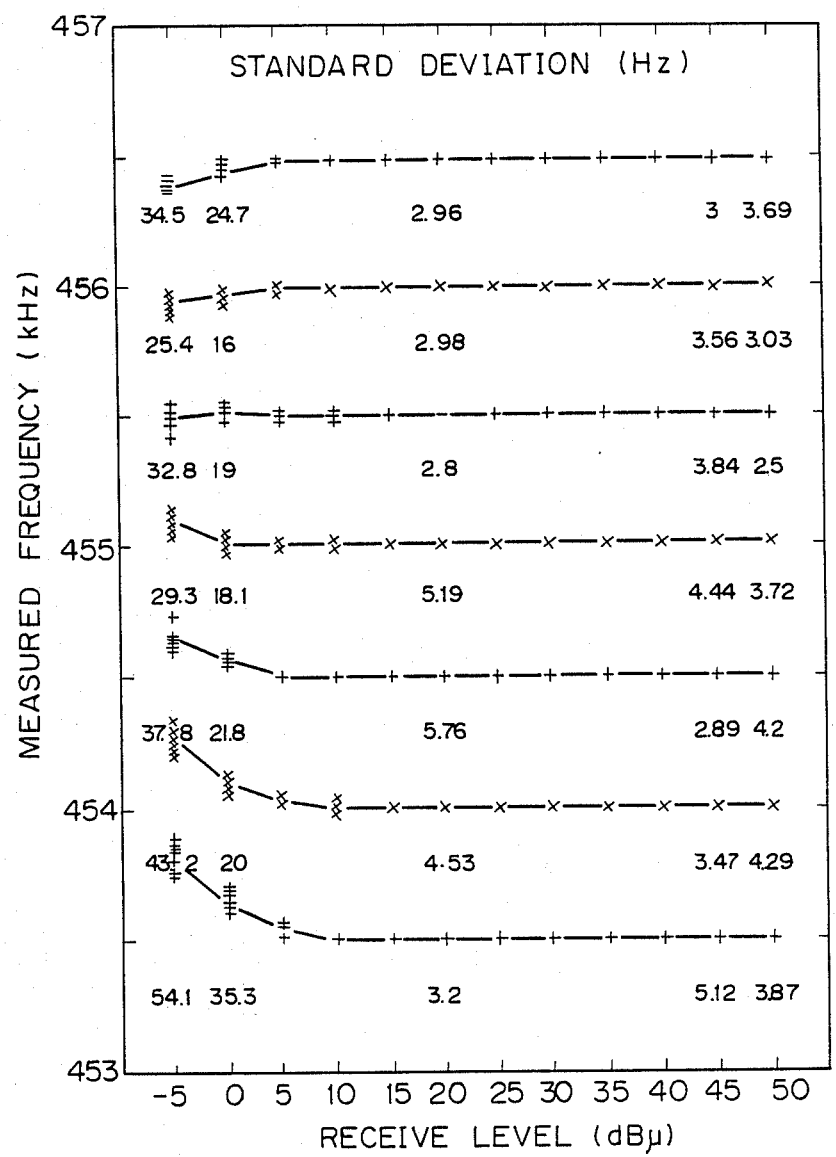
FIG. 4 is frequency measuring accuracy of the present invention obtained by the experiment.

FIG. 4 shows the curves showing the effect of the fading to the measured result, in which the maximum Doppler frequency is 40 Hz which corresponds to the moving speed of approximate 50 km/hour in 800 MHz. In FIG. 4, the vertical axis shows the measured frequency, the horizontal axis shows the receive signal level, and the figures in the curves show the standard deviation (Hz). The modulation signal in FIG. 4 is a pseudo speech signal having the average modulation index 1.5 (rad/s) and the split phase coded PN data signal multiplexed under said speech signal spectrum with the maximum frequency deviation 0.6 kHz. The gate time of the time base signal of the counter is 1.0 second. The sensitivity of the receiver (12 dB SINAD) is 0 dBµ, and the passband is 8 kHz. FIG. 4 shows that the standard deviation of the measured value under fading is only 10 Hz when the receive signal level is 10 dBµ. So, it should be noted that the present invention provides the sufficient measurement accuracy.

Figure 5:
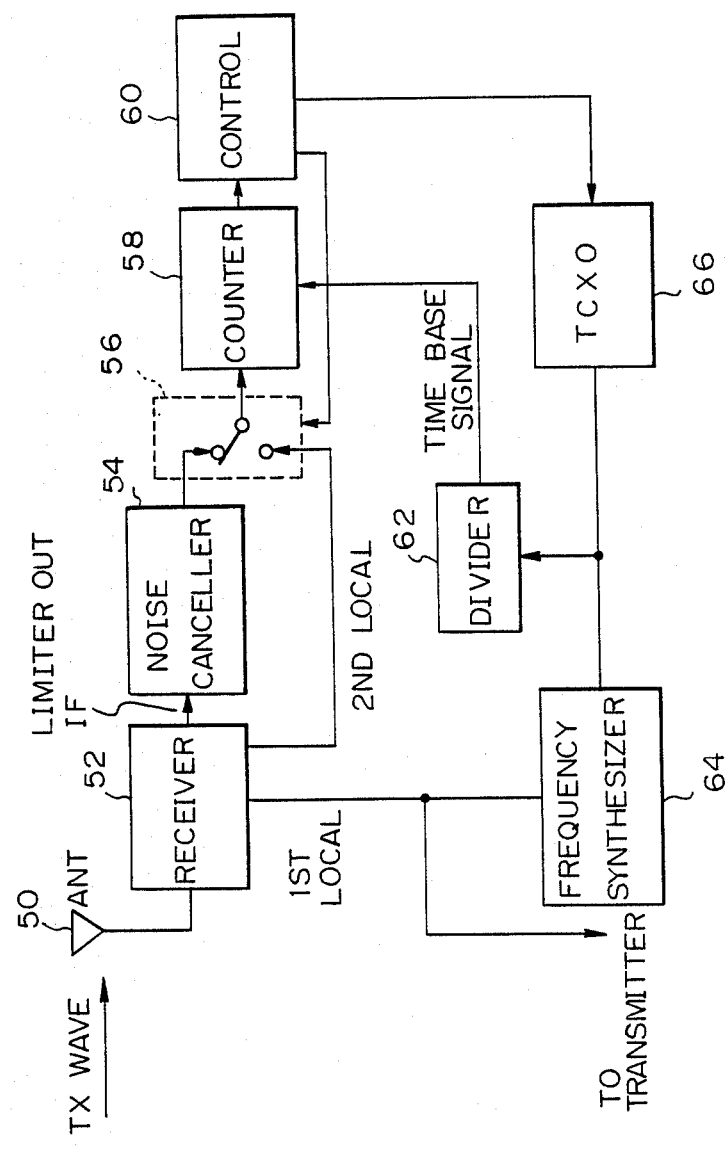
FIG. 5 is a block diagram of another embodiment of the receiver according to the prement invention.

FIG. 5 shows a block diagram of another embodiment of the present invention, in which the measurement error due to the drift of the second local frequency is compensated.

In the figure, the numeral 50 is an antenna, 52 is a receiver which includes a first mixer, a second mixer, a first IF filter, a second IF filter, a limiter, and a second local oscillator, so 52 corresponds to 3.6, 3.7, 3.8, 3.9, 3.10 and 3.11 in FIG. 3. The numeral 54 is a noise canceller, and corresponds to 3.13 in FIG. 3. The numeral 58 is a digital frequency counter corresponding to 3.14 in FIG. 3. The numeral 60 is a control corresponding to 3.16 in FIG. 3. The numeral 62 is a frequency divider corresponding to 3.17 in FIG. 3. The numeral 64 is a frequency synthesizer corresopnding to 64 (3.2, 3.3 and 3.4) in FIG. 3. The numeral 66 is a standard oscillator of a quartz crystal oscillator corresponding to 3.1 in FIG. 3. The numeral 56 is a switch for selecting an input of the counter 58 between an output of the noise canceller 54 and the second local frequency of the receiver 52 according to the output of the control 60. The output of the counter 58 is applied to the control 60 which performs the calculation for the compensation of the second local frequency, and is simply implemented by a single chip micro-processor. Other structure of FIG. 5 is the same as that of FIG. 3. The output of the synthesizer 64 may also be used as a transmit frequency.

The compensation of the error by the second local frequency is analyzed below.

The second local frequency is measured by the counter 58 with the time base signal from the standard oscillator 66 through the frequency divider 62, as is the case of the embodiment of FIG. 3.

The measured value is:

$$\hat{F_{i2}} = (F_a - F_{L1}(1'\epsilon_1) - F_{L2}(1'\epsilon_2))/(1+\epsilon_1) = (F_{i2} - F_{L1}\epsilon_1 - F_{L2}\epsilon_2)/(1+\epsilon_1) \quad (6)$$

When the switch 56 is switched to the second local frequency, the measured value is:

$$\hat{F_{L2}} = F_{L2}(1+\epsilon_2)/(1+\epsilon_1) \quad (7)$$

Those two measured values ae added to each other.

$$\hat{F_{i2}} + \hat{F_{i1}} = (F_{i2} - F_{L1}\epsilon_1 + F_{L2})/(1+\epsilon_1) \quad (8)$$

It should be noted that the equation (8) does not include ($\epsilon_2$) which is the error of the second local frequency. Since $F_{i2}$ and $F_{L2}$ are known, and $F_{L1}$ is determined when the receive channel is determined, the error ($\epsilon_1$) of the first local frequency is given as follows from the equation (8).

$$\epsilon_1 = (F_{i2} + F_{L2} - (\hat{F}_{i2} + \hat{F}_{L2}))/(\hat{F}_{i2} + \hat{F}_{L2} + F_{L1}) \quad (9)$$

Thus, the error of the first local frequency, or the error of the receive frequency is measured, irrespective of the error of the second local frequency.

The equation (6) has the assumption that the second local frequency is the lower local frequency. When the second local frequency is the upper local frequency, the equation (6) is changed as follows.

$$F_{i2} = (F_{i2} + F_{L1}\epsilon_1 + F_{L2}\epsilon_2)/(1+\epsilon_1) \quad (10)$$

When the equation (7) which is the measurement result of the second local frequency is subtracted from the equation (10), the error ($\epsilon_1$) which is free from the error of the second local frequency is given as follows.

$$\epsilon_1 = (F_{i2} - F_{L2} - (\hat{F}_{i2} + \hat{F}_{L2}))/(\hat{F}_{i2} + \hat{F}_{L2} - F_{L1}) \quad (11)$$

The control 60 connects the counter 58 to the noise canceller 54, by controlling the switch 56, then, connects the counter 58 to the second local frequency by switching the switch 56. Then, the equation (9) or (11) is calculated in the control 60.

Figure 6:
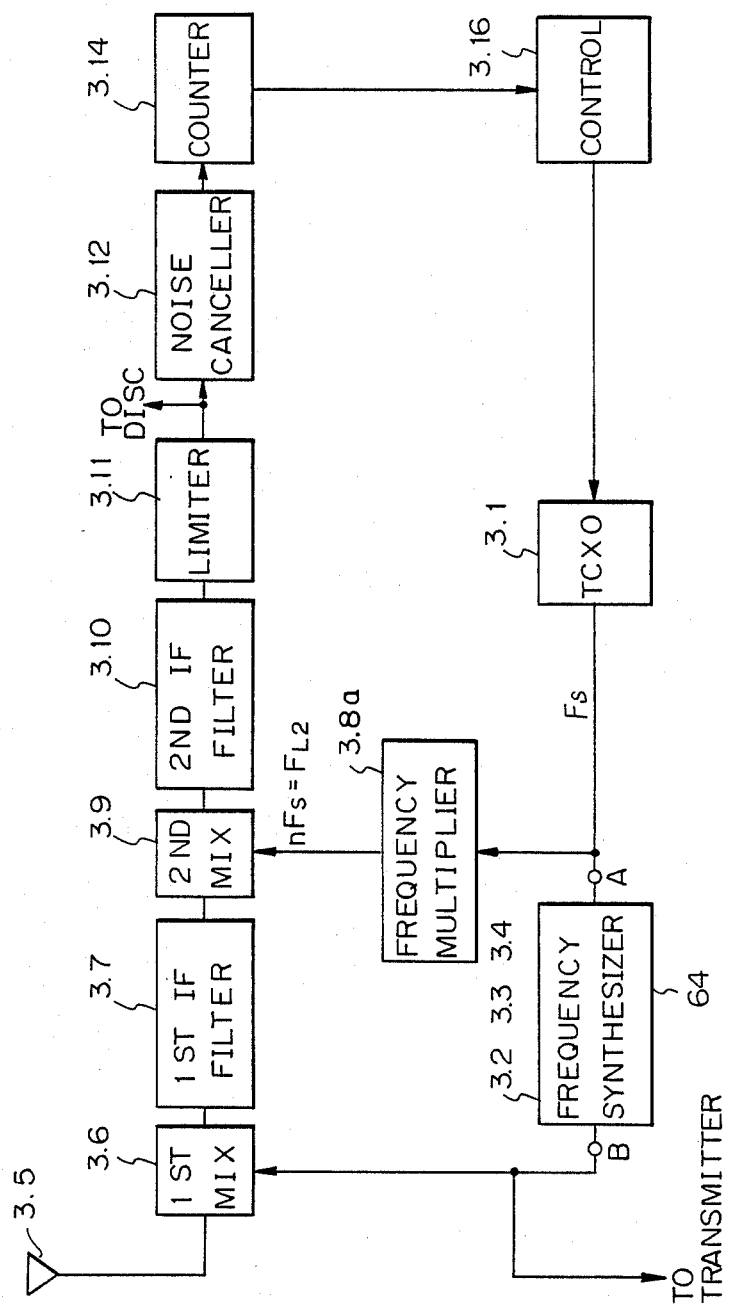
FIG. 6 is a block diagram of still another embodiment of the present invention.

FIG. 6 shows a block diagram of another embodiment of the present invention. The feature of the embodiment of FIG. 6 is that the second local frequency is obtained by multiplying or dividing the standard frequency. The same numerals in FIG. 6 show the same members as those in FIG. 3. When necessary, the output of the synthesizer 64 is used for the frequency for a transmitter of a mobile subscriber set.

The numeral 3.8a is a frequency multiplier coupled with the output of the standard frequency oscillator 3.1 and the second mixer 3.9 so that n number of multiple frequency of the basic frequency Fs is obtained. Thus, the second local frequency $F_{L2} = n \cdot F_s$ is obtained, where Fs is the output frequency of the standard oscillator (TCXO) 3.1.

When the second local frequency is selected to n·Fs (n is an integer), the second IF (Intermediate Frequency) is as follows.

$$F_{i2} = F_{i1} - n \cdot F_s \quad (12)$$

So, accuracy of the second local frequency is the same as that of first local frequency, but can not select arbitrary. However, it should be noted that said restriction of the second local frequency is not serious.

When the second local frequency which the control has been impossible, is locked to the first local frequency, it becomes possible to control the second local frequency itself.

When a multiple channel synthesizer is used as a first local oscillator, the equation (12) is changed to:

$$F_{i2} = F_a - (K + Ch \cdot F_s/M) - n \cdot F_s \quad (13)$$

where K is the lowest frequency of the first local frequencies, and Ch is the channel number, M is the ratio of the standard frequency to the phase comparison frequency of the frequency synthesizer.

Thus, it should be appreciated in the equation (13) that the error of the second local frequency depends upon only the error of the standard oscillator.

Assuming that both the first local and the second local use the lower locals, when the standard frequency has the error so that the standard frequency is lower than the desired frequency, the second IF frequency is simultaneously lowered. Therefore, the control 3.16 intends to compensate the error so that the standard frequency is increased, depending upon the difference between the desired nominal second IF frequency and the measured second IF frequency (equation (4)). The control is performed until the measured second IF frequency coincides with the nominal frequency or the error becomes less than an allowable value. Similarly, when the standard frequency is higher than the nominal value, the measured second frequency $F_{L2}$ becomes higher than the nominal value, and so the control 3.16 controls the standard oscillator so that the output frequency is lowered.

Therefore, it should be appreciated that the error of the second local frequency is removed, although that error of the second local frequency can not be removed in a prior art.

The first local frequency and the second local frequency may be the higher frequencies. However, the combination that the first local frequency is the higher one, and the second local frequency is the lower one, and/or the combination that the first local frequency is the lower one and the second local frequency is the higher one is impossible in the structure of FIG. 3.

As for the restriction of the second local frequency, it is not serious. For instance, when the first IF is 90 MHz which is popular in mobile communication, and the standard frequency of TCXO is 12.8 MHz, the second IF may be 400 KHz, by selecting the second local frequency to 7 times of the standard frequency ($7 \times 12.8$) and to be the lower local frequency.

Figure 7:
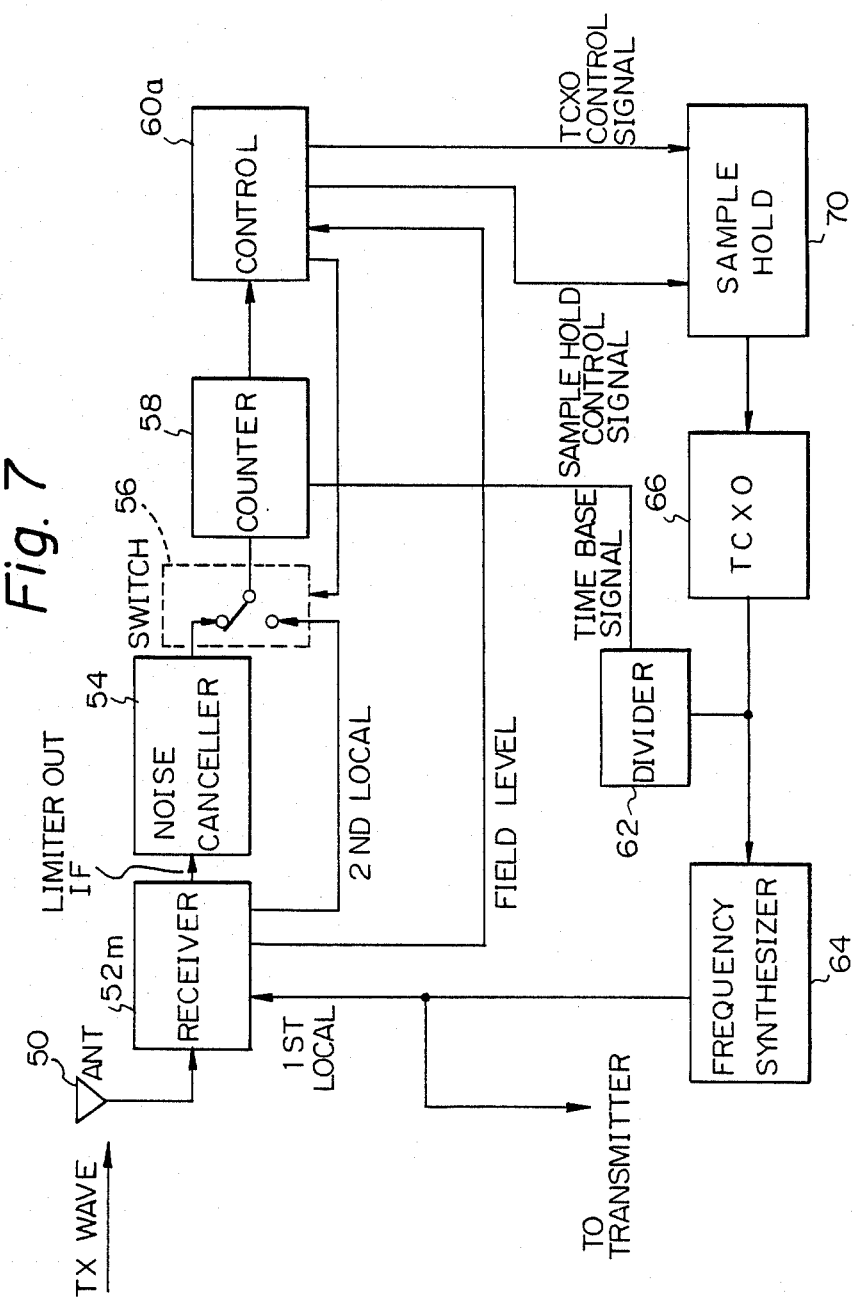
FIG. 7 is a block diagram of still another embodiment of the present invention.

FIG. 7 is a block diagram of still another embodiment of the present invention. In FIG. 7, the same numerals as those in FIG. 5 show the same members as those in FIG. 5. The feature of the embodiment of FIG. 7 is that the receiver 52m is able to provide the receiver input level, the control 60a accepts the receiver input level signal, and the presence of the sample hold circuit 70.

The control 60a carries out the control as described in accordance with FIG. 5 only when the receiver input level is higher than a predetermined value by applying the TCXO control signal to the sample hold circuit 70. When the receiver input level is lower than the predetermined level, the control 60a does not provide said TCXO control signal but provides the sample hold control signal.

The sample hold circuit 70 operates as follows. When the TCXO control signal is active, that signal is transferred to the standard oscillator 66 to control the same. When the control of the standard oscillator 66 finishes, the TCXO control signal stops, and the sample hold circuit 70 keeps the control signal just before the TCXO signal stops. Then, the control of the standard oscillator is carried out by the signal kept in the sample hold circuit 70. When the receiver input level is lower than the predetermined value, the control of the standard oscillator 66 is of course performed by the control signal kept in the sample hold cirucit 70.

The embodiment of FIG. 7 is advantageous that the control is performed only when the receiver input level is higher than a predetermined value, and therefore, the control is not disturbed by noise in case of deep fading. Further, it should be appreciated that the TCXO is so stable that no continuous control is necessary, but an intermittent control, for instance once a year is enough for keeping frequency stability.

Preferably, the sample hold circuit 70 has a battery power source which operates even when a main switch of a mobile subscriber set gets off so that the frequency is accurate when the receiver set gets on next time.

Figure 8:
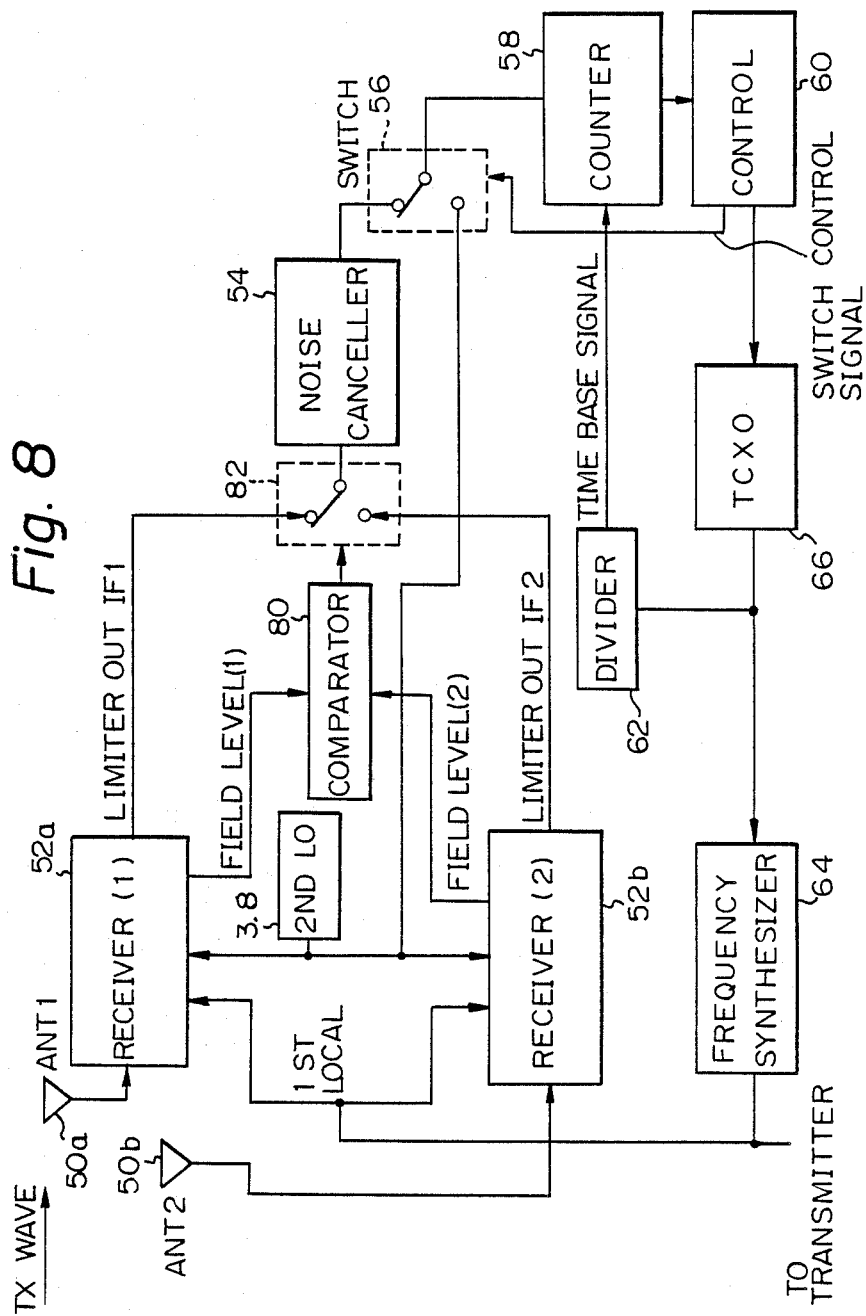
FIG. 8 is a block diagram of still another embodiment of the present invention.

FIG. 8 is a block diagram of still another embodiment according to the present invention. The same numerals in FIG. 8 as those in FIG. 5 show the same members as those in FIG. 5.

The feature of the embodiment of FIG. 8 as compared with that of FIG. 5 is that the embodiment of FIG. 8 has a pair of receivers 52a and 52b, each of which is the same as the receiver 52m in FIG. 7 which provides the receive signal level information. The embodiment of FIG. 8 has also a level comparator 80 which compares the receive level of each receivers, and a switch 82 to select one of the receivers so that the receiver with the higher receive level is selected.

Therefore, the configuration of FIG. 8 is a so-called space diversity system having a pair of antennas 50a and 50b, and a pair of receivers 52a and 52b, together with the level comparator 80 and the switch 82. Other portions of FIG. 8 are the same as the embodiment of FIG. 5.

The embodiment of FIG. 8 has the advantage that the frequency control is carried out depending upon the higher receive signal, and therefore, the frequency control is not disturbed by a noise when the receive signal level is low because of fading.

Figure 9:
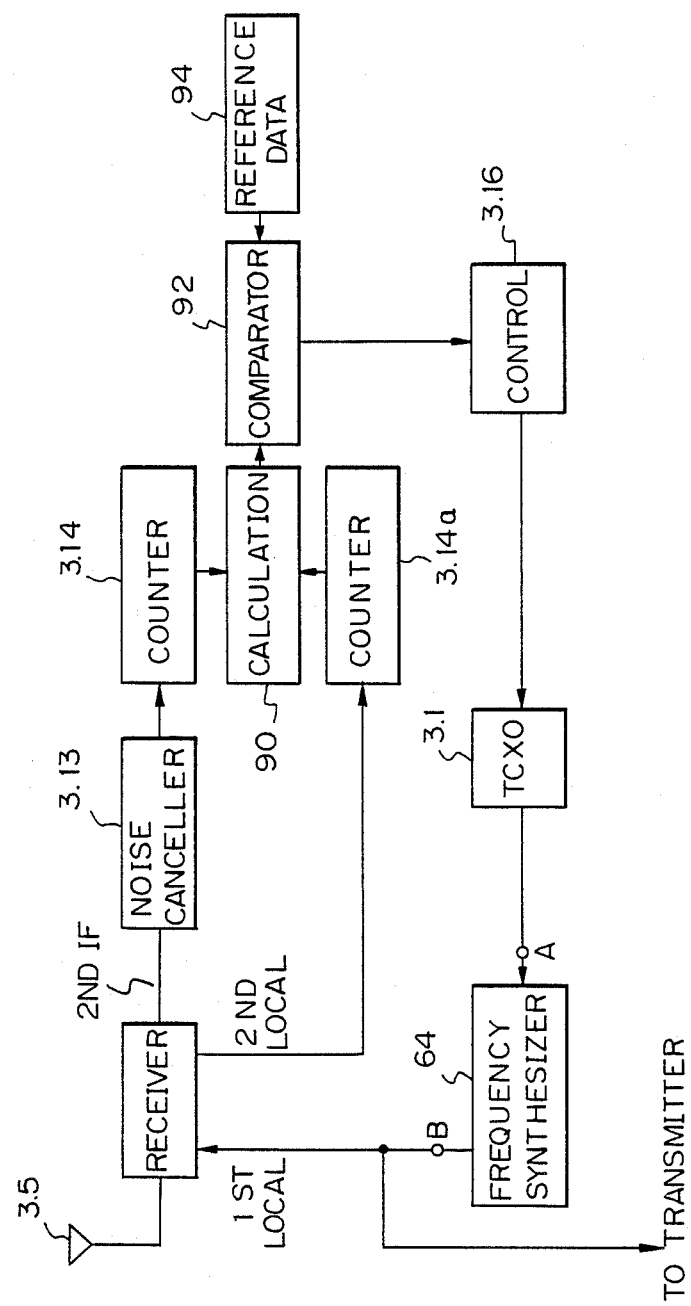
FIG. 9 is a block diagram of still another embodiment of the present invention.

FIG. 9 is a block diagram of still another embodiment according to the present invention. The feature of the embodiment of FIG. 9 is that both the second IF frequency and the second local frequency are measured and those two measured values are calculated to compensate the error of the first local frequency.

The same numerals in FIG. 9 as those in FIG. 3 show the same members as those in FIG. 3. The numeral 52 is a receiver which includes the first mixer, the second mixer, the first IF filter, the second IF filter, and the amplitude limiter. The receiver 52 provides not only the second IF output signal, but also the second local frequency. The embodiment of FIG. 9 has a pair of digital frequency counters 3.14 and 3.14a, a calculator 90 for calculating the outputs of those counters, a reference data 94 which provides the correct value of the first IF frequency, and a comparator 92 for comparing the output of the calculator 90 with the output of the reference data 94. The output of the comparator 92 is applied to the control 3.16 which controls the standard oscillator (TCXO) 3.1.

It is assumed that the receive frequency at the antenna 3.5 is $F_a$, the first local frequency is $F_{L1}$, the first IF frequency is $F_{i1}$, the second local frequency is $F_{L2}$, and the second IF frequency is $F_{i2}$. Then, the relationships of the table 2 are satisfied.

TABLE 2

| $F_{L1}$ | $F_{i1}$ | $F_{L2}$ | $F_{i2}$ | $F_{i1}$ (calculation) |
|---|---|---|---|---|
| upper | $F_{L1} - F_a =$ | upper | $F_{L2} - (F_{L1} - F_a)$ | $F_{L2} - F_{i2}$ |
|  | $F_{i1}$ | lower | $(F_{L1} - F_a) - F_{L2}$ | $F_{L2} + F_{i2}$ |
| lower | $F_a - F_{L1} =$ | upper | $F_{L2} - (F_a - F_{L1})$ | $F_{L2} - F_{i2}$ |
|  | $F_{i1}$ | lower | $(F_a - F_{L1}) - F_{L2}$ | $F_{L2} - F_{i2}$ |

When we intend to compensate the first local frequency based upon the measurement of the second IF frequency, the error of the second local frequency must be compensated. If the first IF frequency is measured, it would be possible to compensate the first local frequency based upon the meaured first IF frequency. However, since the first IF signal is low in level, so it would be difficult to measure the first IF frequency directly. Therefore, the present embodiment measures both the second IF frequency and the second local frequency, instead of the first IF frequency, and provides the equivalent first IF frequency through the calculation based upon said table 2.

The first local frequency is calculated from the second local frequency and the second IF frequency as shown in the table 2. Therefore, the measurement of the second IF frequency and the second local frequency is enough for providing the error of the first local frequency.

In FIG. 9, the calculator 90 provides the sum (when the second local frequency is the lower one) or the difference (when the second local frequency is the upper one) of the second local frequency and the second IF frequency to provide the first local frequency. It should be noted that when the second local frequency has some error, that error appears in the result of the calculator 90. The comparator 92 compares the output of the calculator 90 (measured first local frequency) with the reference first local frequency from the reference data 94, and the difference between those two values is applied to the control 3.16, which controls the standard oscillator 3.1 so that the output of the comparator 92 becomes zero. Thus, the frequency synthesizer 64 is adjusted considering the error of the second local frequency.

Figure 10:
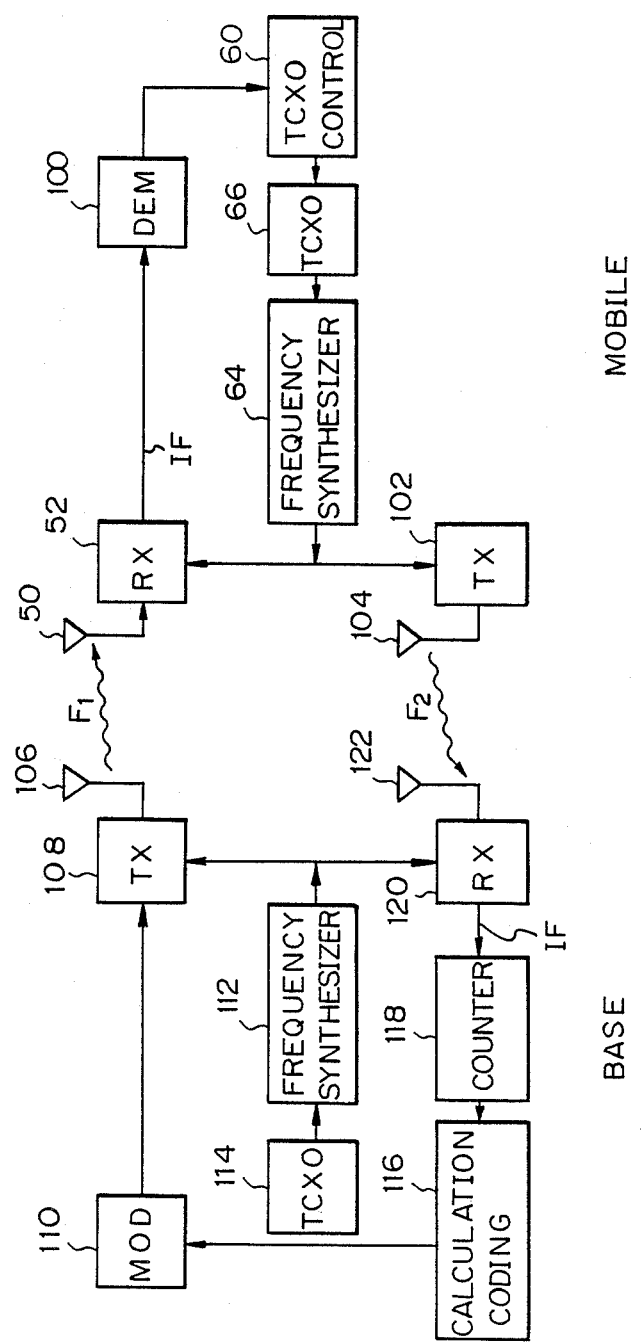
FIG. 10 is a block diagram of still another embodiment of the present invention.

FIG. 10 is a block diagram of still another embodiment according to the present invention. The feature of the embodiment of FIG. 10 is that the frequency error of a subscriber set is measured in a base station, and the measured result is transmitted to the subscriber set through radio channel. Then, the subscriber set adjusts the error according to the error information from the base station.

The transmit frequency F2 of the subscriber set is received by the receiver 120 in the base station through the antenna 122. The frequency counter 118 which is a digital frequency counter measures the IF frequency in the receiver of the base station. When the result of the measurement by the counter 118 has the error higher than the allowable value, the error which the subscriber set must remove is coded in the calculation coding circuit 116, and the coded information is transmitted to the subscriber set thorugh the modulator 110, the transmitter 108, and the antenna 106, with the transmit frequency F1.

It should be appreciated that the measurement in the base station using the standard oscillator 114 and the frequency synthesizer 112 is quite accurate, since the base station is a fixed large station, and so, can use the excellent standard oscillator with the excellent temperature compensation.

The subscriber set receives that error information by the receiver 52 through the antenna 50. The demodulator 100 demodulates the coded error information. And, the control 66 decodes the signal, and controls the standard oscillator (TCXO) 66 according to the decoded error signal. So, it is supposed that the output of the control 66 is essentially the same as the output of the 3.16 in FIG. 3.

The measured data in the base station is transmitted to the subscriber station through one of the following means.

(a) Data signal transmission multiplexed in the lower side of a speech band.

(b) Data transmission through common control signal, which is used at the initial stage of a mobile communication including channel switching, identification of a subscriber set, and/or a channel number. The measured data is carried in that common control signal.

(c) Data transmission through common control signal during speech. When the error compensation must be carried out during speech, the speech must be interrupted for a short while. The base station sends the particular tone signal, and then, sends the common control signal which carries the measured frequency error information. The subscriber set recognizes the measured error signal, which follows the particular tone signal which functions a trigger signal of the frequency compensation operation.

As a modification of the present invention, when a subscriber set has separate independent local oscillators for a receiver and a transmitter, respectively, the present invention can adjust both the local oscillators. First, a local oscillator for a receiver is adjusted as mentioned in according with FIG. 3, or one of FIGS. 5 through 10. Then, an input of a synthesizer of a receiver is switched to an output of a standard oscillator of a transmitter so that the reception is carried out using a standard oscillator of a transmitter. So, as in the case of the adjustment of a receiver, the measurement of IF frequency and the adjustment of a standard oscillator according to the measured result provides the adjustment of the standard oscillator of a transmitter. After the adjustment, the standard oscillator of a transmitter is coupled with a synthesizer of a transmitter.

From the foregoing, it will now be apparent that a new and improved mobile communication system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A mobile subscriber apparatus for angle modulated signal having at least a frequency mixer for converting radio receive frequency to intermediate frequency by using local frequency, a limiter for limiting amplitude of intermediate frequency signal, a discriminator coupled output of said limiter for demodulating angle modulated signal, a standard oscillator by a quartz crystal oscillator for providing said local frequency,
   wherein improvements comprise
   a digital frequency counter is coupled with output of said limiter to measure intermediate frequency,
   control means for adjusting frequency of said quartz crystal oscillator depending upon output of said digital frequency counter, and
   a noise canceller provided between an output of said limiter and an input of said digital frequency counter.

2. A mobile subscriber apparatus for angle modulated signal according to claim 1, further comprising a frequency synthesizing having a loop circuit of a voltage controlled oscillator, a phase detector and a frequency divider is provided at output of said quartz crystal oscillator for providing adjustable local frequency.

3. A mobile subscriber apparatus for angle modulated signal according to claim 1, further comprising a frequency divider to divide output frequency of said standard oscillator to provide a time base signal to said digital frequency counter.

4. A mobile subscriber apparatus for angle modulated signal according to claim 1, wherein a second mixer and a second local frequency are mounted to provide an intermediate frequency, and a switch is provided to select an input of said digital frequency counter between said intermediate frequency and said second local frequency, and said standard oscillator is adjusted according to measure of two frequencies by the digital frequency counter.

5. A mobile subscriber apparatus for angle modulated signal according to claim 1, wherein means for measuring receive level is provided so that said control means is active only when the receive level is higher than a predetermined level, and a sample hold circuit is provided to hold a control level by said control means when receive level is higher than said predetermined level, so that said control means operates with a control level held in the sample hole circuit when the receive level is lower than said predetermined level.

6. A mobile subscriber apparatus for angle modulated signal according to claim 1, wherein a second mixer is provided, and a frequency multiplier is provided for providing a second local frequency to said second mixer by multiplying output frequency of said standard frequency.

7. A mobile subscriber apparatus for angle modulated signal according to claim 1, wherein a plurality of frequency mixers together with a common local frequency, a comparator and a switch for selecting the highest level of intermediate frequency are provided, and the selected intermediate frequency is applied to the digital frequency counter.

8. A mobile subscriber apparatus for angle modulated signal according to claim 2, wherein a transmitter is provided, and transmit frequency is provided by said frequency synthesizer.

9. A mobile subscriber apparatus for angle modulated signal according to claim 1, wherein the digital frequency counter for measuring IF frequency is provided in a mobile base station to measure receive IF frequency, said base station has means for forwarding error of IF frequency thus measured to a subscriber set, and a subscriber set derives information of error from the base station to adjust standard oscillator in a subscriber set.

* * * * *